United States Patent [19]

Nicollini et al.

[11] Patent Number: 5,668,494
[45] Date of Patent: Sep. 16, 1997

[54] CIRCUIT AND METHOD FOR DRIVING ALTERNATIVELY ELECTRIC LOADS WITH LOW IMPEDANCE

[75] Inventors: Germano Nicollini, Piacenza; Sergio Pernici, Bergamo, both of Italy

[73] Assignee: SGS-Thomson Microelectronics S.r.l., Agrate Brianza, Italy

[21] Appl. No.: 451,030

[22] Filed: May 31, 1995

[30] Foreign Application Priority Data

Jul. 29, 1994 [EP] European Pat. Off. ............. 94830388

[51] Int. Cl.[6] .................... H03K 17/693; H03F 3/18
[52] U.S. Cl. .................... 327/416; 327/404; 327/409; 327/108; 330/51; 330/148; 307/38
[58] Field of Search .................... 327/108, 415, 327/416, 417, 519, 403, 405, 404, 408, 409, 411, 412, 413, 410, 295; 307/38, 29; 330/51, 148

[56] References Cited

U.S. PATENT DOCUMENTS

| | | | |
|---|---|---|---|
| 3,238,386 | 3/1966 | Schaffner | 327/417 |
| 3,335,292 | 8/1967 | Alburger | 327/417 |
| 3,761,826 | 9/1973 | Lowe | 327/415 |
| 4,177,432 | 12/1979 | Hobrecht | 330/252 |
| 4,198,607 | 4/1980 | Beinitze et al. | 330/148 |
| 4,571,508 | 2/1986 | Koga et al. | 327/415 |
| 4,647,794 | 3/1987 | Guajardo | 327/410 |
| 4,767,945 | 8/1988 | Quinn | 327/412 |
| 5,293,082 | 3/1994 | Bathaee | 327/108 |
| 5,361,041 | 11/1994 | Lish | 330/255 |
| 5,399,986 | 3/1995 | Yen | 330/148 |

FOREIGN PATENT DOCUMENTS

| | | | |
|---|---|---|---|
| 2-60317 | 2/1990 | Japan | 327/411 |
| 5226948 | 12/1993 | Japan | H03F 3/45 |

OTHER PUBLICATIONS

M. Manninger, "Asics fur Die Signalverabeitung," Elektronik, vol. 37, No. 6, p. 57 (1988).

*Primary Examiner*—Timothy P. Callahan
*Assistant Examiner*—Terry L. Englund
*Attorney, Agent, or Firm*—Robert Groover; Matthew S. Anderson; Groover and Associates

[57] ABSTRACT

An electronic driver circuit for low-impedance loads, being of a type which comprises an input terminal (IN) to which a voltage signal (Vin) is applied for alternate transfer to an output, and a plurality of output terminals (OUTi), each connected to a corresponding electric load (2), further comprises, between the input terminal and the output terminals, a single operational amplifier (3) having multiple output stages (7), one for each output terminal (OUTi). The operational amplifier (3) is of the single-ended or fully differential multistage type and allows each load to be driven alternately by activation of the corresponding output stage (7i).

30 Claims, 2 Drawing Sheets

$$GAIN = -\frac{Z_2}{Z_1}$$

CIRCUIT AND METHOD FOR DRIVING ALTERNATIVELY ELECTRIC LOADS WITH LOW IMPEDANCE

FIELD OF THE INVENTION

This invention relates to an electronic circuit for driving in an alternate fashion low-impedance electric loads.

The invention also concerns a method for driving low-impedance electric loads.

In particular, the invention relates to a circuit for driving low-impedance electric loads, being of a type which comprises an input terminal, whereto a voltage signal is applied for subsequent alternate transfer to an output, and a plurality of output terminals, each connected to a corresponding electric load.

As is well known, many electronic applications involve the availability of integrated circuits capable of driving a plurality of low-impedance loads in an alternate fashion.

A typical example of such applications is cellular phones, whereto an integrated circuit is incorporated which is to drive directly, but alternately, at least three sound transducers.

In particular, these transducers include:

a handset earpiece representing an electric load of approximately 100 Ohms and 350 nF;

an approximately 30-ohm loudspeaker; and a second handset earpiece of about 600 Ohms.

The moment it is operated, each transducer should be the only one to receive the electric signal.

BACKGROUND ART

The prior art has already proposed some solutions to fill this demand.

A first solution is illustrated schematically by FIG. 1 of the accompanying drawings. This Figure shows a circuit which comprises an operational amplifier of the single-ended type having an input terminal and an output terminal. The output terminal is connected to a plurality of outputs OUTi of the circuit through respective selection switches SWi.

A voltage signal Vin applied to the input terminal of the amplifier can be transferred alternately to a given output OUTi by driving its corresponding selection switch SWi. Each switch may be implemented with a CMOS transfer.

However, this prior solution only holds when the impedance of each load at the output end is comparatively high. In fact, the selection switches associated with each load should have a power-on resistance Ron which is much lower than the impedance of the corresponding load, in order to fully transfer the electric signal.

Assuming that a load of 30 Ohms is to be driven, the resistance Ron of the switch should then be less than 3 Ohms, and a MOS transistor of a huge size would be required to produce such a value. In addition, to design a circuit for operation on a power supply Vcc of just 3 Volts, p-channel MOS transistors with a W/L geometrical ratio of 50,000 to 1.2 and n-channel MOS transistors with a 10,000 to 1.2 ratio would have to be used. Due to such drawbacks, a second known solution, illustrated schematically in FIG. 2, has been employed hitherto.

This second solution basically provides for the switches to be shifted to somewhere ahead of the amplifier, specifically at the amplifier input end. This means, in essence, that an amplifier will be associated with each of the outputs OUTi.

While being an improvement on the previously described solution, this has a drawback in that an amplifier must be provided after each switch; accordingly, the solution is a costly one in terms of circuit layout and power consumption.

The technical problem underlying this invention is to provide a driver circuit, and method therefor, which have uniquely simple structural and functional features and such that electric loads, even low-impedance loads, can be driven alternately, thereby overcoming the limitations of the prior solutions.

SUMMARY OF THE INVENTION

The solutive idea on which this invention stands is one of using a single operational amplifier having multiple output stages which can be selected and operated in an alternate fashion.

Based on this solutive idea, the technical problem is solved by a circuit as indicated above and defined in the appended claims.

The technical problem is also solved by a driving method as defined in the appended claims.

The features and advantages of the inventive circuit and method will be apparent from the following detailed description of an embodiment thereof, to be taken by way of example and not of limitation with reference to the accompanying drawings.

DETAILED DESCRIPTION

Figure 3:
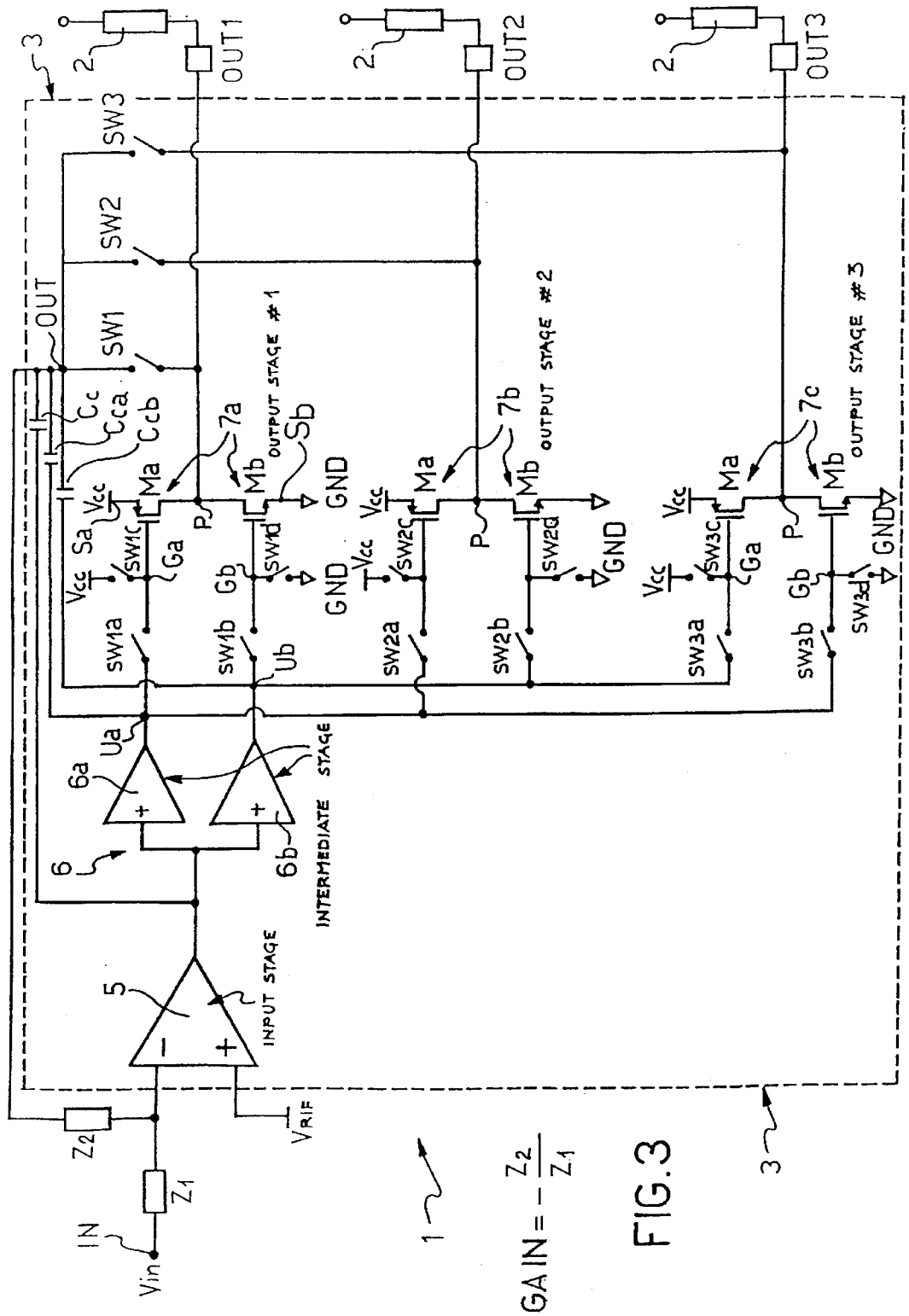
FIG. 3 is a diagram illustrating schematically an embodiment of the driver circuit of this invention.

With reference in particular to FIG. 3, generally and schematically shown at 1 is a drive circuit embodying the invention and adapted to power in an alternate fashion low-impedance electric loads, denoted by 2.

The circuit 1 has an input terminal IN which is applied an electric voltage signal Vin to be transferred alternately to a selected output OUTi connected to one of the loads 2.

In the example illustratively discussed herein, the circuit 1 has three outputs, namely: OUT1, OUT2, OUT3, each connected to a corresponding load 2.

The circuit 1 comprises an operational amplifier 3 having a first or inverting (−) input, a second or non-inverting (+) input, a first output terminal OUT for setting the circuit gain, and a plurality of further output terminals OUTi, one for each load 2. The amplifier 3 is powered across a first voltage reference Vcc and a second reference, such as a signal ground GND.

The input IN of the circuit 1 is connected to the inverting (−) input of the operational amplifier 3 through an impedance Z1. A constant voltage reference Vrif is maintained at the other, non-inverting (+) input of the amplifier 3.

Advantageously, the operational amplifier 3 comprises three stages 5, 6 and 7 cascade connected to one another, namely: a first input stage 5 to which the aforesaid inverting (−) and non-inverting (+) inputs belong, an intermediate stage 6, and at least one output stage 7.

Furthermore, the amplifier 3 is a single-ended type with nested-Miller compensation, as described in "A CMOS low-distortion fully differential power amplifier with double nested-Miller compensation", IEEE JSSC, July 1993, for example.

However, the considerations set forth herein below may also apply to operational amplifiers of the fully differential type and to other forms of compensation as well.

The amplifier 3 has an external feedback between the first output terminal OUT and the inverting (−) input, in which an impedance Z2 is connected. This feedback sets the gain Gam for the amplifier 3 as the ratio of the impedances of Z2 and Z1, Gam=−Z2/Z1. The feedback may be resistive, capacitive or a combination thereof.

A first compensation capacitor Cc is connected between the output node OUT and the output of the input stage 5; that is, between the node OUT and the intermediate stage 6 input.

The intermediate stage 6 comprises a pair of amplifiers 6a and 6b connected after the input stage 5 and having respective outputs Ua, Ub.

These outputs Ua, Ub are connected to the input side of a plurality of stages 7a, 7b, 7c, one for each output terminal OUTi, through respective pairs of switches SW1a, Sw1b; SW2a, SW2b; and SW3a, SW3b, that is one pair for each stage 7i.

In addition, a corresponding compensation capacitor Cca, Ccb is connected between each output Ua, Ub of the intermediate stage 6 and the output node OUT of the amplifier 3.

Each stage 7i comprises an output buffer incorporating a complementary pair of MOS transistors Ma, Mb, of the p-channel and n-channel type, respectively. The source terminal Sa of the first transistor Ma is connected to the supply voltage reference Vcc, while the source terminal Sb of the second transistor Mb is connected to the second voltage reference, i.e. the signal ground GND.

The output Ua of the amplifier 6a is connected to the gate terminal Ga of the first transistor Ma via the switch SW1a. Another switch, SW1c, connects the gate Ga to the voltage reference Vcc.

The output Ub of the amplifier 6b is connected to the gate terminal Gb of the second transistor Mb via the switch SW1b. A further switch, SW1d, connects the gate Gb to ground GND.

The transistors Ma and Mb connect to each other at the node P through their respective drain terminals.

The node P interconnecting the transistors Ma and Mb essentially represents the output of each stage 7i and is connected directly to one of the output terminals of the circuit 1.

Also provided is a switch SWi between each node P of each stage 7i and the output terminal OUT of the amplifier 3.

All the switches described can be implemented with CMOS transfer of minimal, or at least very small, area, since they are in series with no low impedance.

The turning on/off of such switches is controlled by voltage signals generated by other circuitry, external of the circuit 1 and not shown because such circuitry is conventional.

Figure 1:
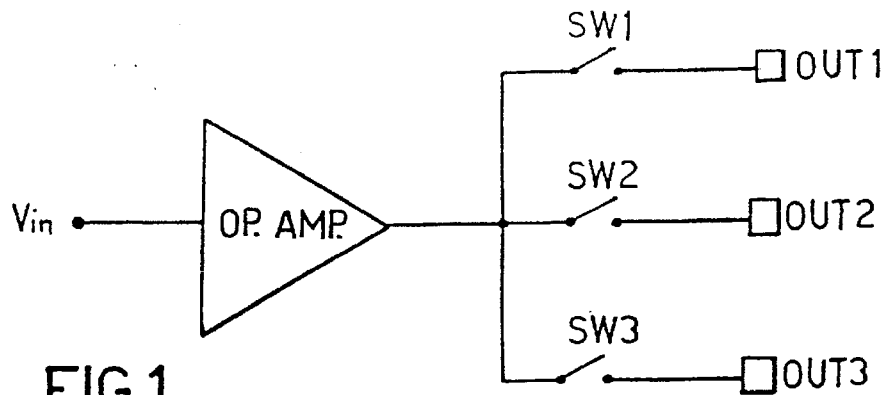
FIG. 1 is a diagram illustrating schematically a driver circuit for electric loads according to the prior art.
Figure 2:
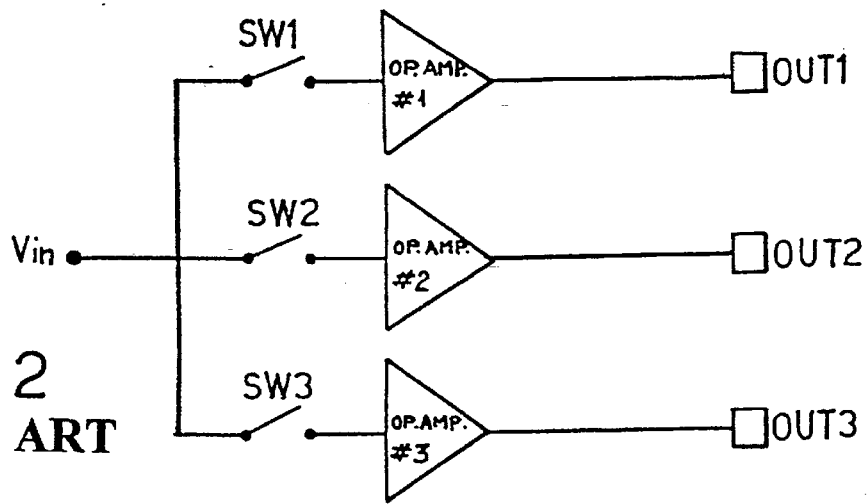
FIG. 2 is a diagram illustrating schematically a second driver circuit for electric loads according to the prior art.
Figure 4:
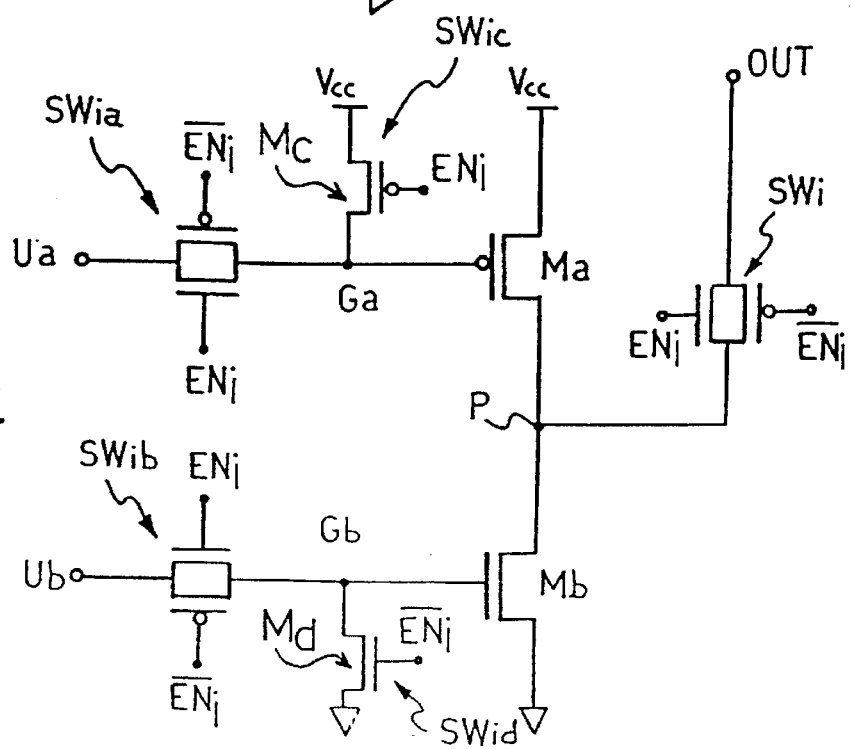
FIG. 4 is a diagram illustrating schematically a detail of one of the output stages of the circuit of FIG. 3.

An exemplary embodiment of one of the output stages 7i of the amplifier 3 is illustrated in greater detail by FIG. 4.

Switches SWia, SWib, respectively connected to the outputs Ua and Ub of the intermediate stage 6, are each implemented by means of a complementary pair of MOS transistors, one of the p-channel and the other of the n-channel type. Such transistors have their respective source and drain terminals connected together.

The gate terminal of the n-channel transistor receives an enable signal $EN_i$ from the aforesaid external circuitry, while at the same time the gate terminal of the other, p-channel transistor receives a signal $EN/_i$ in phase opposition to the enable signal.

The switch SWi which connects the output node P to the first output terminal OUT is also implemented by a similar complementary pair of MOS transistors.

On the other hand, for the switch SWic which connects the gate terminal Ga of the transistor Ma to the voltage supply reference Vcc, a transistor Mc of the p-channel MOS type, having its source terminal connected to the voltage supply and drain terminal connected to the gate Ga, is preferred. The gate terminal of said transistor Mc receives, in turn, the enable signal $EN_i$.

The other switch, SWid, which connects the gate terminal Gb of the transistor Mb to the signal ground GND is implemented by a transistor Md of the n-channel MOS type having its drain terminal connected to the gate Gb and its source terminal connected to ground. The gate terminal of said transistor Md receives the signal $EN/_i$ which is the complement of the enable signal $EN_i$.

The operation of the circuit 1, as well as the driving method according to this invention will now be described briefly.

Upon closing the switch pair SWia, SWib, the outputs Ua and Ub of the intermediate stage 6 become connected to one of the output stages 7a or 7b or 7c, and by concurrently closing the switch SWi associated with the output P of that particular stage 7a or 7b or 7c, the connection to all the compensation capacitors Cc, Cca and Cb and the feedback impedance Z2 will be completed.

The other output stages, by contrast, are held open because the gate terminal Ga of the first output transistor Ma, of the p-channel type, is connected to the voltage supply reference Vc as a result of the switch SWic being closed; while the gate terminal Gb of the other output transistor, Mb of the n-channel type, is connected to ground as a result of the switch SWid being closed.

Stated otherwise, the stages 7a or 7b or 7c are respectively selected by means of the switches SWia, SWib and SWi such that only one of them will be on to output power to a corresponding load 2, while the non-selected stages are turned off through the switches SWic and SWid.

In this way, the voltage signal Vin at the input IN will be transferred to a load 2 connected to the output OUTi which has been selected by activation of the corresponding output stage 7i.

Thus, the inventive method provides for each low-impedance load to be driven directly from an amplifier having a plurality of cascaded stages the last of which comprises a plurality of output stages 7a, 7b, 7c, . . . connected in parallel. Only one of these output stages will be activated or deactivated according to whether that particular output OUTi of the driver circuit is to be driven or not.

The invention does solve the technical problem and affords a number of advantages, first among which is that the proposed solution allows electric loads having a low impedance to be driven in an efficient manner.

In fact, the circuit of this invention includes a single operational amplifier, so that power requirements can be significantly less than with prior solutions.

In addition, the overall area occupied by the circuit may be regarded as being much smaller than with prior solutions, because the invention affording savings in layout that would be missed by prior solutions employing multiple amplifiers, each involving the need to have their respective compensation capacitors and feedback impedances duplicated.

Changes and modifications may be made unto the circuit described hereinabove within the scope of the invention as defined in the following claims.

We claim:

1. An electronic driver circuit for low-impedance electric loads, comprising:
   an input terminal whereto a voltage signal is applied, and
   a plurality of output terminals, each said output terminal being connected to a corresponding electric load; and
   an input amplifier, connected between the input terminal and the output terminals, having
      a single input stage having a first input functionally connected to receive said voltage signal, and an output connected to vary in dependence on said first input; and
      a plurality of output stages, one for each output terminal, each functionally connected to receive said output from said single input stage; said output stages being connected with switches so that a selected one of said output stages, and not the other ones of said output stages, is enabled to drive the respective one of said output terminals, and to provide a negative feedback signal to said first input of said single input stage.

2. The circuit of claim 1, characterized in that said input amplifier is a single-ended multistage type.

3. The circuit of claim 1, characterized in that said input amplifier is a fully differential multistage type.

4. The circuit of claim 2, characterized in that said input amplifier is a nested-Miller compensated type.

5. The circuit of claim 2, characterized in that each of said plurality of output stages comprises an output buffer with a complementary pair of transistors connected between a first voltage reference and a second voltage reference and driven from an intermediate stage of said input amplifier.

6. The circuit of claim 5, characterized in that a control terminal of a first transistor of said complementary pair of transistors is connected to the first voltage reference through a first switch and the control terminal of a second transistor of said complementary pair of transistors is connected to the second voltage reference through a second switch.

7. The circuit of claim 5, characterized in that each output buffer has an output node connected to said first input of said input amplifier through another respective switch.

8. The circuit of claim 1, further comprising an intermediate stage which is connected to be driven by said output of said input stage, and which comprises at least one pair of amplifiers having a respective pair of outputs, and that each stage in said plurality of output stages is connected to the outputs of the intermediate stage through a respective pair of said switches.

9. An integrated multiple-alternate-output driver circuit, comprising:
   a first amplifier stage, connected to receive and amplify an input signal to provide a first amplified signal, and also having a negative feedback input; and
   a plurality of final amplifier stages connected to be individually enabled, and
      each functionally connected, when enabled, to drive a respective individual output in correspondence with said first amplified signal, and
      each functionally connected, when enabled, to drive said negative feedback input of said first amplifier stage in common with said respective individual output.

10. The circuit of claim 9, wherein each said final amplifier stage consists of a single CMOS stage.

11. The circuit of claim 9, wherein all but said enabled final amplifier stage provides an open circuit.

12. The circuit of claim 9, wherein said plurality of final amplifier stages consists of three stages.

13. The circuit of claim 9, wherein said negative feedback input connection of said first amplifier stage comprises a series resistor interposed therein.

14. An integrated multiple-alternate-output driver circuit, comprising:
   a first amplifier stage, connected to receive and amplify an input signal to provide a first amplified signal, and also having a negative feedback input;
   an intermediate amplifier stage, connected to receive and amplify said first amplified signal, to accordingly provide a second amplified signal as an output;
   a plurality of final amplifier stages connected to be individually enabled, and
      each functionally connected, when enabled, to drive a respective individual output in correspondence with said second amplified signal, and
      each functionally connected, when enabled, to drive said negative feedback input of said first amplifier stage in common with said respective individual output.

15. The circuit of claim 14, wherein each said final amplifier stage consists of a single CMOS stage.

16. The circuit of claim 14, wherein all but said enabled final amplifier stage provides an open circuit.

17. The circuit of claim 14, wherein said first amplified signal is a single-ended signal and said second amplified signal is a differential signal.

18. The circuit of claim 14, wherein said plurality of final amplifier stages consists of three stages.

19. The circuit of claim 14, wherein said negative feedback input connection of said first amplifier stage comprises a series resistor interposed therein.

20. A method for operating an integrated multiple-alternate-output driver circuit, comprising the steps of:
   (a.) receiving and amplifying an input signal in a first amplifier stage, to thereby provide a first amplified signal;
   (b.) amplifying said first amplified signal in only a selected one of a plurality of final amplifier stages, while disabling others of said plurality of final amplifier stages; said final amplifier stages being connected to drive multiple respective output connections; and
   (c.) feeding back said respective output connection of only said selected final amplifier stage, to provide a negative feedback connection to said first amplifier stage; said step (a.) being performed in dependence on signals received at said negative feedback connection.

21. The circuit of claim 20, wherein each said final amplifier stage consists of a single CMOS stage.

22. The circuit of claim 20, wherein all but said enabled final amplifier stage provides an open circuit.

23. The circuit of claim 20, wherein said plurality of final amplifier stages consists of three stages.

24. The circuit of claim 20, wherein said negative feedback connection of said first amplifier stage comprises a series resistor interposed therein.

25. A method for operating an integrated multiple-alternate-output driver circuit, comprising the steps of:
- (a.) receiving and amplifying an input signal in a first amplifier stage, to thereby provide a first amplified signal;
- (a'.) receiving and amplifying said first amplified signal in an intermediate amplifier stage, to thereby provide a second amplified signal;
- (b.) amplifying said second amplified signal in only a selected one of a plurality of final amplifier stages, while disabling others of said plurality of final amplifier stages; said final amplifier stages being connected to drive multiple respective output connections; and
- (c.) feeding back said respective output connection of only said selected final amplifier stage, to provide a negative feedback connection to said first amplifier stage; said step (a.) being performed in dependence on signals received at said negative feedback connection.

26. The circuit of claim 25, wherein each said final amplifier stage consists of a single CMOS stage.

27. The circuit of claim 25, wherein all but said enabled final amplifier stage provides an open circuit.

28. The circuit of claim 25, wherein said first amplified signal is a single-ended signal and said second amplified signal is a differential signal.

29. The circuit of claim 25, wherein said plurality of final amplifier stages consists of three stages.

30. The circuit of claim 25, wherein said negative feedback connection of said first amplifier stage comprises a series resistor interposed therein.

* * * * *